350-442 SR -
OR 3,536,380
X4090N
Oct. 27, 1970 E. T. FERGUSON 3,536,380
DEVICE FOR APPLYING A PLURALITY OF EQUAL ELEMENTS
TO A SEMICONDUCTOR SUBSTRATE BY MEANS
OF A PLURALITY OF UNEQUAL MASKS
Filed Jan. 26, 1968
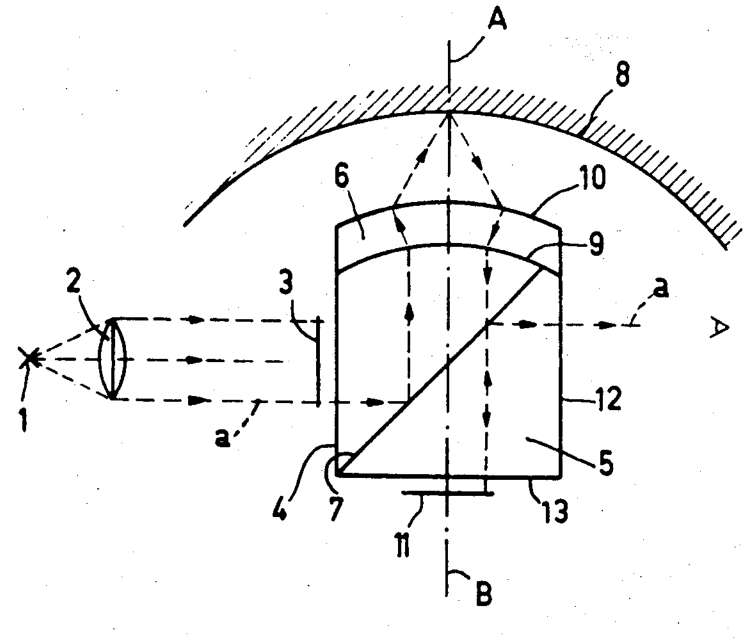
ERIC T. FERGUSON INVENTOR.
BY
AGENT United States Patent Office
3,536,380
Patented Oct. 27, 1970

3,536,380
DEVICE FOR APPLYING A PLURALITY OF EQUAL ELEMENTS TO A SEMICONDUCTOR SUBSTRATE BY MEANS OF A PLURALITY OF UNEQUAL MASKS

Eric Tapley Ferguson, Emmasingel, Eindhoven, Netherlands, assignor, by mesne assignments, to U.S. Philips Corporation, New York, N.Y., a corporation of Delaware Filed Jan. 26, 1968, Ser. No. 700,970
Claims priority, application Netherlands, Feb. 1, 1967, 6701520
Int. Cl. G02b *17/08*
U.S. Cl. 350—199 2 Claims

ABSTRACT OF THE DISCLOSURE

Apparatus for imaging successive mask patterns on semiconductor substrates in the manufacture of semiconductor devices. An optical system is employed comprising a spherical mirror, a first concavo-convex lens and a second plano-convex lens all being concentric. By locating the masks opposite a side surface, and the substrate opposite the planar surface of the second lens, the mask and substrate may be optically registered by viewing same through the opposite side surface.

The invention relates to a device for applying a plurality of equal elements to a semiconductor substrate by means of a plurality of unequal masks which each include a plurality of equal patterns, the number of patterns on each mask being at least equal to the number of elements.

Such a device is known. A mask including a large number of equal patterns is disposed on a semiconductor substrate coated with a thin film resistant to a particular chemically or physically corrosive environment, after the substrate has been coated with a layer of a so-called photoresist. The substrate is exposed to preferably short-wave light through the mask. The resist layer may, for example, have the property of becoming insoluble in a given solvent after being exposed to short-wave light. The unexposed part of the resist layer is removed with the said solvent. The uncovered part of the resistant film is removed by a special method. It may, for example, be removed by etching with a special solution. After the exposed part of the resist layer has been removed by a suitable method, the substrate is reacted with a suitable substance in an atmosphere containing this substance. The substance, may, for example, be diffused into the substrate. After the reaction of diffusion the substrate is again coated with the resistant layer. When the substrate consists of silicon, in the conventional technique, the resistant layer may consist of silicon oxide.

The described cycle is now repeated using a mask containing equal patterns which are equal in number to the patterns of the first mask but differ therefrom in configuration. For manufacturing particular passive and/or active elements several different masks are required.

The known device has disadvantages which are related to the fact that the mask must make contact with the layer on the substrate, for the definition of the image of the mask formed on the substrate has to satisfy exacting requirements. In addition, owing to the extremely small dimensions of a pattern the correct position of the mask relative to the substrate must be inspected and adjusted with a microscope, which has a small depth of field.

Firstly dust particles caught between the mask and the substrate may give rise to undesirable exposure points in the resist layer, which may be the cause of undesirable diffusion points and hence to discrepancies in the elements manufactured.

Secondly, the mask may be damaged when it is pressed against the substrate and adjusted in the correct position relative to the substrate, for in the treatment of the substrate frequently small pointed dendritically grown crystals are produced which project from the substrate. When the mask is being pressed against the substrate strikes such a pointed projection (or a dust particle) damage to the pattern is often inevitable. These injuries on the one hand give rise to discrepancies in the elements manufactured and on the other hand cause high mask wear.

It is an object of the invention to obviate the said disadvantages by forming an image of the mask on the substrate without physical contact between the mask and the substrate. For this purpose, the invention is characterized in that images of the mask are formed on the substrate by means of an optical system comprising a lens system and a spherical mirror, which lens system comprises at least two lenses of which the surfaces intersecting the optical axis have the same or substantially the same centre of curvature as the mirror, with the exception of the surface most remote from the mirror, which surface is a plane or substantially plane surface at right angles to the optical axis, the optical distance from the mask to the mirror being substantially equal to the radius of curvature of the mirror.

The invention is based on the known recognition that by means of such an optical system there is formed in the object plane a substantially faultless inverted image of unit magnification of an object located substantially in the centre of curvature of the concave mirror of the system.

The mask and the substrate may be arranged in one plane one on either side of the optical axis of the system. However, this has the disadvantage that the diameter of the system must be twice as large as is required for the given diameters of the mask and the substrate. Thus the optical system will be comparatively large and expensive.

The diameter of the optical system can be reduced. For this purpose, according to a feature of the invention the lens system includes a half-silvered plane mirror which makes an acute angle with the optical axis.

This elegantly enables the correct image of the mask formed on the substrate to be inspected, because an image of both elements is formed at an accessible location, namely in a plane at right angles to the plane of the substrate which is situated outside the optical system.

In order that the invention may readily be carried into effect, an embodiment of a device in accordance with the invention will now be described with reference to the accompanying drawing.

Referring now to the single figure of the drawing, light rays from a source of radiation 1 and rendered parallel by a lens 2 are normally incident through a mask 3 on the plane surface 4 of two lenses 5 and 6 cemented together. The lens 5 is of the plano-convex type, the lens 6 of the concavo-convex type. The convex surface of the lens 5 having an index of refraction $n_1$, which is cemented to the concave surface of the lens 6 having an index of refraction $n_2$, has a centre of curvature which coincides with that of the convex surface 10 of the lens 6 and also with that of a concave mirror 8 disposed near the concave surface 10. In other words, the spherical surfaces 9 and 10 are concentric with the spherical surface 8.

The lens system 5, 6 includes a half-silvered plane mirror 7 which makes an angle of 45° with the optical axis AB. The rays entering the system 5, 6 through the surface 4 are partially reflected from the mirror 7, refracted by the surfaces 9 and 10 and reflected by the concave mirror 8. Through the surfaces 10 and 9 the rays again strike the half-silvered mirror 7. The part of the radiation beam which is transmitted leaves the lens system through a plane surface 13 and is coincident on the surface of the substrate 11 which is disposed at right angles to the optical axis AB in the immediately proximity of the centre of curvature of the spherical surfaces 8, 9 and 10. The plane of the mask 3 is also at an optical distance from the mirror 8 substantially equal to its radius of curvature.

The beam reflected from the substrate 11 then enters the lens 5 through the surface 13, is partly reflected from the semi-silvered plane mirror 7 and leaves the lens system through a plane surface 12.

The rays leaving the lens system are preferably examined by means of a microscope. The position of the image of the mask 3 formed on the substrate 11 can be changed by displacement of the substrate 11.

Obviously, the plane of the mask 3 and that of the substrate 11 extend symmetrically or substantially symmetrically with respect to the mirror 7.

For the sake of clarity the drawing shows the path of a single ray ($a$) only.

In a practical embodiment the lens 5 had an index of refraction $n_1=1.69$ and the lens 6 an index of refraction $n_2=1.75$.

The radii of curvature of the surfaces 9, 10 and 8 were 4, 8 and 21 cm., respectively. The dimensions of the mask 3 were 40 x 40 mm. and comprised 6,000 patterns each having a surface area of 0.1 sq. mm.

What is claimed is:

1. Apparatus for imaging patterns on successive masks onto a semiconductor substrate, comprising an optical system having an optical axis, said optical system including a spherical mirror having a center of curvature along the optical axis of the system, said optical system further including a lens system including at least two lenses whose curved surfaces intersecting the said optical axis, except for the surface most remote from the mirror, have substantially the same center of curvature as that of the mirror, said most remote surface being substantially plane and extending at right angles to the optical axis and being located opposite to the curved surfaces, said lens system also having oppositely-disposed plane side surfaces extending at right angles to the plane of the most remote surface, said masks being positionable opposite to one side surface of the lens system and located at an optical distance from the mirror substantially equal to its radius of curvature, the substrate being positionable in a plane substantially parallel to the said most remote surface at an optical distance from the mirror substantially equal to its radius of curvature, and a half-silvered plane mirror located in the lens comprising the plane surfaces, said half-silvered mirror being disposed in a plane extending at 45° to the most remote plane surface and to the said one side surface.

2. Apparatus as set forth in claim 1 wherein means are provided for simultaneously viewing each mask and the substrate to register same through the side plane surface opposite to said one plane surface.

References Cited

UNITED STATES PATENTS 2,801,570 8/1957 Nomarski et al. ------ 350—199

FOREIGN PATENTS 1,471,508 1/1967 France.

JOHN K. CORBIN, Primary Examiner

U.S. Cl. X.R.

350—202, 205